United States Patent [19]
Crawford et al.

[11] Patent Number: 5,161,090
[45] Date of Patent: Nov. 3, 1992

[54] HEAT PIPE-ELECTRICAL INTERCONNECT INTEGRATION FOR CHIP MODULES

[75] Inventors: Robert K. Crawford, Palo Alto; Jacques Leibovitz, San Jose; Daniel J. Miller, San Francisco, Calif.; Kim H. Chen, Fremont, all of Calif.

[73] Assignee: Hewlett-Packard Company, Palo Alto, Calif.

[21] Appl. No.: 806,997

[22] Filed: Dec. 13, 1991

[51] Int. Cl.⁵ .............................................. H05K 7/20
[52] U.S. Cl. ............................ 361/385; 165/104.33; 174/15.2; 357/82; 361/414
[58] Field of Search ............... 174/252, 15.2, 261–263; 357/82; 165/80.4, 80.5, 104.22, 104.23, 104.26, 104.33; 361/383, 385, 386, 388, 400, 403, 405, 410, 414

[56] References Cited

U.S. PATENT DOCUMENTS

| | | | |
|---|---|---|---|
| 4,967,314 | 10/1990 | Higgins, III | 361/414 |
| 4,994,215 | 2/1991 | Weich, Jr. | 264/27 |
| 5,095,359 | 3/1992 | Tanaka | 357/74 |

FOREIGN PATENT DOCUMENTS

0083538 7/1983 European Pat. Off. ............ 361/385

Primary Examiner—Gerald P. Tolin

[57] ABSTRACT

Method and apparatus for controlling the temperature of one or more electrical component chips positioned on a face of a substrate and for providing component-to-component electrical interconnect traces between the chips. One or a selected set of electrical interconnections, contained within the substrate and connected to a chip, is also connected to a column of high electrical and thermal conductivity material within the substrate that is in direct thermal contact with the working fluid in a heat pipe. The heat pipe is sealed and is contained in the substrate interior and is in electrical and thermal contact with the electronic components on a chip. The heat pipe working fluid receives heat from the electronic components through the thermally conducting column, changes phase through absorption of this heat, and transports the heat to heat dissipation means located elsewhere.

18 Claims, 9 Drawing Sheets

HEAT PIPE-ELECTRICAL INTERCONNECT INTEGRATION FOR CHIP MODULES

FIELD OF THE INVENTION

This invention relates to removal of heat from electronic component chips while the chips are in operation, using apparatus that is an integral part of the electronic assembly.

BACKGROUND OF THE INVENTION

The density of electronics components on a semiconductor chip structure, which has increased one thousand-fold in the last ten years, is limited in part by the need to remove heat generated by operation of these chips. Chips have been moved closer together in order to reduce the time for a signal to propagate from one chip to another. Some components, such as static and dynamic random access memory units ("RAMs") generate relatively little heat in operation, as little as 0.25 Watts per unit. Other semiconductor devices, such as signal processing chips, produce thermal energy at a rate of 5–35 Watts. As the real estate on a semiconductor structure that is allocated to a given chip is reduced, the problem of heat generation becomes more intractable, for at least two reasons: (1) The heat produced per unit area and per unit time increases proportionally with the chip density; and (2) A given chip may generate heat at a much higher rate than its nearest neighbor chips and thus contribute unexpectedly to the thermal environment in which these nearest neighbor chips operate.

Several approaches have been devised to remove heat from a semiconductor device. Mayerhoff et al., in U.S. Pat. No. 3,361,195, disclose use of a heat sink including a plurality of passageways in a substrate, the passageways having an annular or radial, serpentine arrangement and being filled with a heat sink liquid that is force-flowed through the passageways to accept and carry off heat from the device. This approach requires use of an external plenum to accept and cool the returning liquid, requires use of an engine to force the liquid through the passageways, and requires provision of a structure containing the serpentine passageways for each semiconductor device or group of such devices.

In U.S. Pat. No. 3,564,109, Ruechardt discloses use of cooling ribs or fins at the housing wall of a device from which heat is to be removed. The ribs from a single piece and are fabricated from a special heat conducting synthetic material such as a polyester resin, an epoxide resin araldit, silicon or polyproylene. The rib shapes are molded to increase the ratio of exposed cooling area to volume of heat-producing material, and the ribs may have internal ducts through which a liquid is force-flowed.

The heat pipe principle for transport of heat to another location was first discussed by Gaugler in 1944 (U.S. Pat. No. 2,350,349) and by Trefethen in 1962 (G.E. Co. Tech. Info. Ser. No. 615-D114). Grover and co-workers independently invented and fabricated a heat pipe device in 1964 (Jour. of Appl. Phys., vol. 35 (1964) 1190–1191) and demonstrated its effectiveness as an approximately isothermal, heat transmission device.

Transistor cooling by use of a heat pipe with a dielectric powder wick material is disclosed by Sekhon et al. in U.S. Pat. No. 4,047,198. The dielectric wick material is sprayed onto or adhered to all interior surfaces of the heat pipe structure and to all exposed surfaces of the electronic device(s) to be cooled. The wick material is a conformal coating of dielectric powder, which serves as a mat, followed by bundles of glass fibers of average length 0.08 cm and average diameter 0.0008 cm. The heat pipe working fluid is a fluorochemical liquid. The cooling mechanism is not an integral part of the electronic assembly.

Sasaki et al, in U.S. Pat. No. 4,327,399, discloses use of a heat pipe cooling arrangement for IC chips in which the IC is inserted in an aperture in a substrate that directly communicates with a heat pipe cavity containing a wick and a working fluid. The IC also carries a wick, which is aligned with the wick in the heat pipe cavity for direct cooling of the IC. The substrate must have apertures formed therein in order to provide direct access to the working fluid.

Substrate cooling by heat pipe apparatus is disclosed by Wiech in U.S. Pat. No. 4,519,447. The heat pipe contains a working fluid that, in liquid form, passes close to one or more heat-producing components that are positioned on the substrate. A working fluid having low surface tension in liquid form wets the heat pipe wick, and the liquid is heated and vaporized by the heat-producing component(s) in the usual manner. In one embodiment, the working fluid is freon. In another embodiment, used at very high temperatures, the heat-carrying fluid is an electrically conductive liquid, such as liquid mercury, that fills the circulatory loop, and forcedflow circulation occurs in an endless loop by use of magnetohydrodynamic forces applied to the working liquid. These embodiments appear to require that a closed, serpentine path be provided and filled with a liquid in the substrate, in order to allow forced or natural flow of a heat absorbing liquid throughout the substrate. The liquid may undergo an endothermal phase change at the vaporization temperature, or may absorb substrate heat without phase change.

Neidig, et al. disclose use of soldering or similar attachment of a heat sink to a metallized ceramic that serves as substrate for a semiconductor power module, in U.S. Pat. No. 4,727,454. The heat sink may be a heat pipe with a liquid condensation surface that is larger than the thermal communication area connecting the substrate and separate heat sink, and the heat sink is not an integral part of the substrate.

U.S. Pat. No. 4,859,520, issued to Dubuisson, et al., discloses fabrication of a sintered stack of layers of dielectric material to provide an internal system of liquid-carrying ducts in a substrate for heat removal from the substrate. The substrate is formed from a first layer including electrical interconnect traces and a second layer including the internal ducts used for cooling, the two layers being attached to one another by sintering, gluing or the like, and not being interleaved with one another. A fluorine-containing cooling liquid or gas is circulated through the internal ducts for cooling the substrate. The heated fluid returns through an orifice to a cooling reservoir that is separated from the substrate, and the cooling ducts and cooling reservoir form a closed circulatory system.

Sauzade, et al., in U.S. Pat. No. 4,878,152, discloses use of a graphite core, oriented by material compression in one direction, to provide a material with very high lateral thermal conductivity that connects a printed circuit board with a heat sink. Anisotropy in thermal conductivity across the graphite core layer is used to provide the material with a relatively low effective thermal expansion coefficient by siphoning most of the heat in the lateral direction.

SUMMARY OF THE INVENTION

What is needed here is a circuit cooling mechanism that is integrated with the IC or its substrate and with electrical interconnect traces that connect signal terminals on certain ICs. The cooling mechanism temperature range should be flexible, with a circuit operating temperature that can be arbitarily chosen within a reasonably broad temperature range, so the mechanism can be used in a variety of power dissipation environments.

These needs are met by the invention, which provides heat pipe apparatus that is an integral part of the electronic assembly. The apparatus in one embodiment includes a heat pipe wick and fluid phase change chamber, positioned in thermal contact with two or more electronic component chips, positioned on one or more sides of the chamber. The phase change chamber is formed within a slab in one embodiment and contains a working fluid that withdraws heat from the chips to keep the chip operating temperature $T_{chip}$ in an acceptable range that is within a larger range given by $-40°$ C.$\leq T \leq 120°$ C. The phase change chamber includes a heat pipe condenser chamber that receives the working fluid as a gas at a higher temperature, withdraws much of the thermal energy from the working fluid, and returns the working fluid as a liquid, along the heat pipe wick, to a heat pipe evaporator chamber positioned at another end of the phase-change chamber. As the working fluid, in liquid form, moves from the condenser chamber toward the evaporator chamber within the wick, the liquid picks up additional heat from the substrate adjacent to the wick; and this liquid evaporates when the liquid comes near the evaporator chamber end. The vaporized fluid now moves as a gas toward the lower pressure condenser chamber end, and the process is repeated. This recycling process is driven by the waste heat produced by the electronic component chips and delivered to the evaporator chamber (and, to a lesser extent, to the condenser chamber). Thermal contact of a chip with the heat pipe apparatus is provided by solder bumps and electrical vias ("columns") that help provide electrical interconnect between chip components. Means other than solder bumps may be used to provide electrical and thermal contact between a chip or chips and the substrate.

The apparatus also includes a heat dissipator, positioned adjacent to and in thermal contact with the heat pipe condenser chamber that receives most or all of the thermal energy withdrawn from the working fluid. The power density P for withdrawal of thermal energy from a chip by the working fluid may lie in the range 0.5 Watt/cm$^2 \leq P \leq 50$ Watts/cm$^2$. The working fluid is preferably chosen from among fluids having a relatively high surface tension in liquid form and having a vaporization temperature $T_{vap}$ lying in the range $-40°$ C.$\leq T_{vap} \leq 120°$ C.

The substrate that supports the chip contains electrical interconnect traces, which are oriented generally parallel to the substrate surfaces and which may be metal-like or other electrically conducting material. These traces make contact with electrically conducting columns that extend from these traces to one or more chips adjacent to the substrate surface in one direction and that extend from these traces toward the wick of the heat pipe in the opposite direction. These conducting columns serve as electrically conducting vias connected to the traces and also serve as thermally conducting vias, to direct heat produced from the chips to the heat pipe for removal to another location.

DESCRIPTION OF THE BEST MODE

Figure 1:
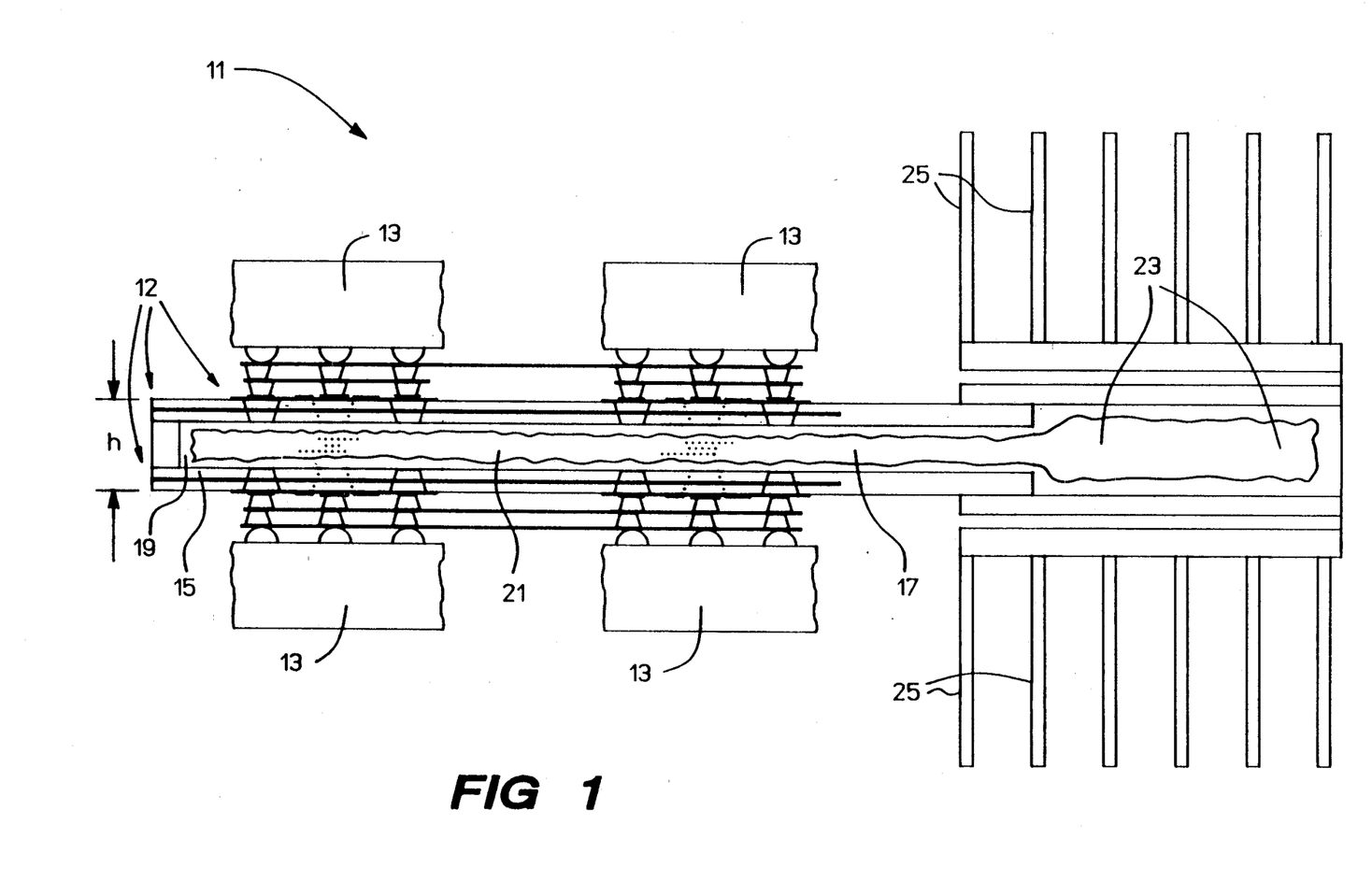
FIGS. 1 and 2 are schematic cross-sectional side and top views of one embodiment of the invention.

FIG. 1 is a cross-sectional view illustrating one embodiment 11 of the invention. A plurality of electronic component chips 13 is positioned on two opposed sides of a substrate 12. The substrate 12 is formed as a slab 15 of thickness h (h$\leq 1$ cm), with its interior having one or a plurality of hollow heat pipe channels 17. The slab 15 and its hollow channels 17 define the heat pipe chamber, and a liquid-carrying wick 19 is positioned at the outer boundary of each hollow channel 17 and runs the length of each such channel. A first end of the hollow channel 17 serves as an evaporator chamber 21. A vapor-liquid interface for the working fluid of the heat pipe is located at or near the end of the evaporator chamber 21. A second end of the hollow channel 17 forms a condenser chamber 23 for conversion of a heated gas to a liquid, after removal of the heat of vaporization of that fluid as the gas-to-liquid phase change occurs. In one embodiment, the second end of the channel 17 is provided with a plurality of fins or heat radiators 25, in thermal communication with the condenser chamber 23, to accept and disperse heat therefrom by radiation and natural or forced air convection. Heat generated by a chip or a plurality of chips 13 may be transferred directly across the substrate material to the evaporator chamber 21, but is more efficiently transferred from chip to heat pipe using vertically oriented thermally conducting columns described below.

As illustrated in FIG. 1, a heat pipe is a closed chamber or tube, partly filled with a mixture of gas and liquid of a chosen fluid (the "working fluid"), with a first (evaporator) end of the channel being lined with a porous wick material that transports liquid therein by means of capillary action. The first end of the heat pipe accepts heat from an external environment (a chip), which heats and vaporizes a portion of the liquid and thereby creates a pressure differential that drives the vapor to a second (condenser) end of the channel. At the condenser end of the channel, the temperature is lower, and the vapor arriving at this end has heat removed therefrom and condenses to a liquid that is taken up by the wick 19. The wick 19 transports this liquid by capillary force toward the evaporator end of the channel where the vaporization-and-condensation cycle is repeated.

Condensation of the gas to a liquid at the condenser end of the chamber liberates thermal energy at least equal to the heat of vaporization of this gas, and this thermal energy is dispersed by other means adjacent to the condenser end of the chamber. The process continues as long as (1) the wick is filled with an adequate amount of working liquid and is not dried out, and (2) a sufficient capillary force is maintained at the vapor-liquid-wall boundary.

Figure 2:
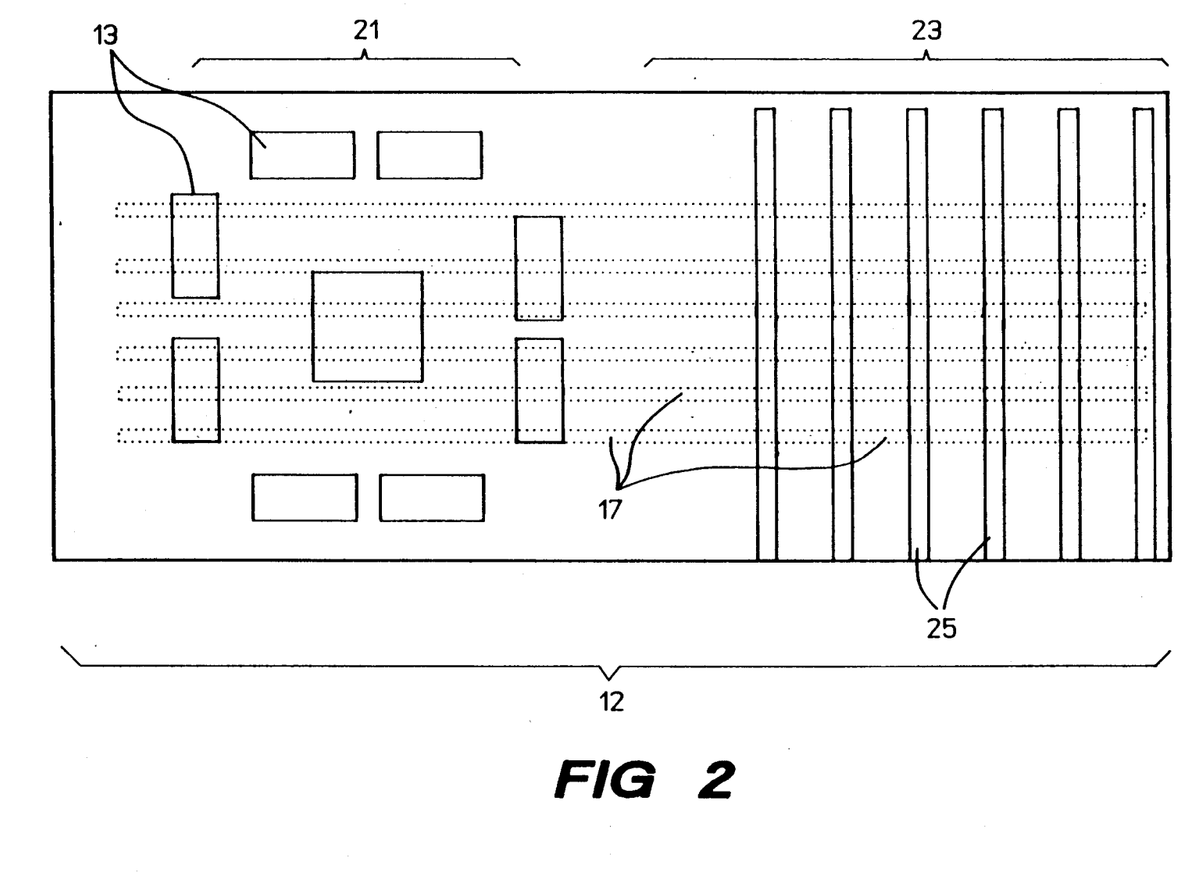

FIG. 2 is a top view of an embodiment of the invention, consistent with the embodiment of FIG. 1, having one or more heat pipe channels 17 positioned in the substrate 12. The substrate 12 has a hollow channel or channels 17 with the evaporator chamber 21 at one end thereof. The condenser chamber 23 at the other end of the channel 17 has a plurality of heat radiators or fins 25 mounted thereon. One or more chips 13 are positioned on the surface of the substrate 12 at the evaporator end of the chamber. FIG. 2 illustrates use of a rectangular slab for the substrate 12.

Figure 3:
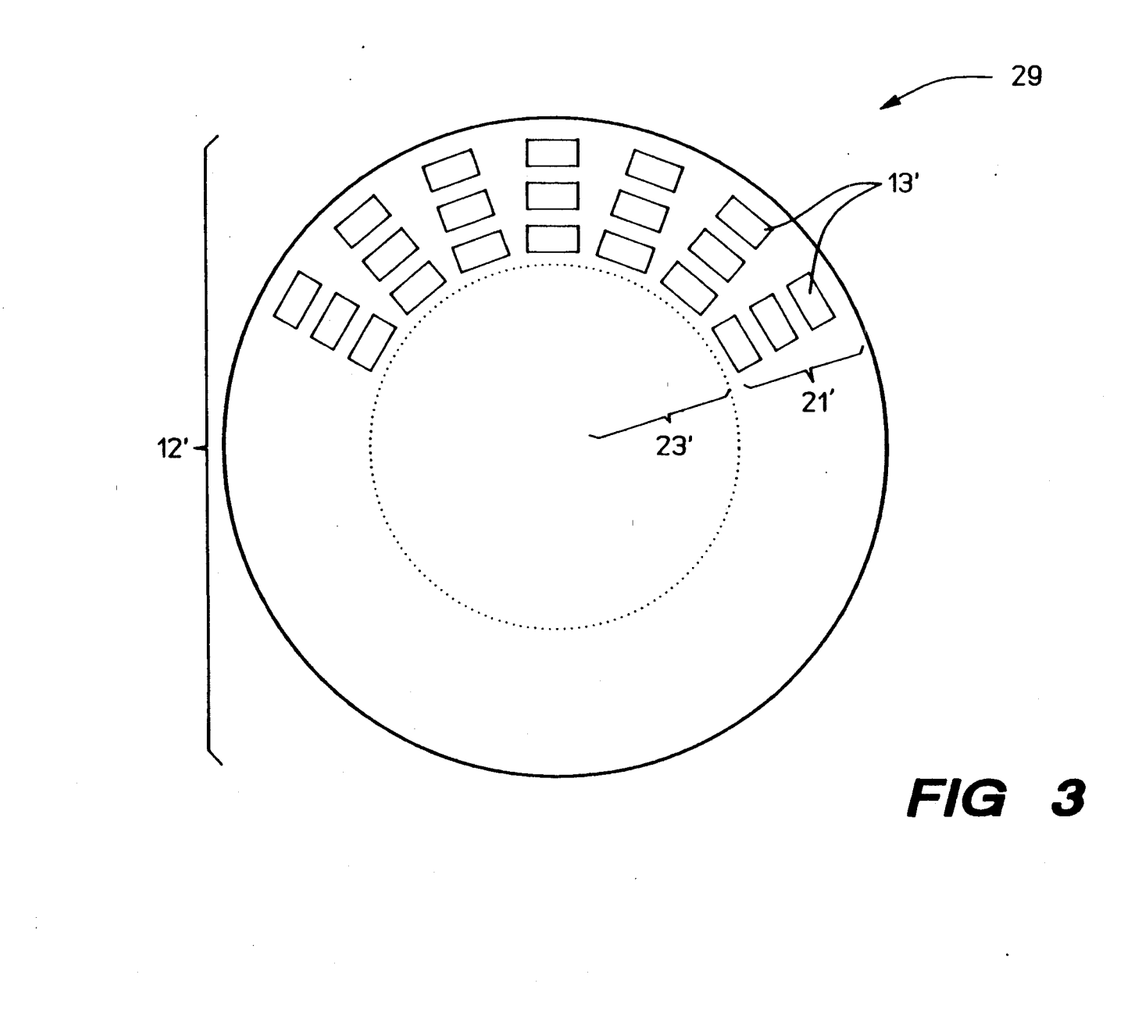
FIGS. 3 and 4 are schematic top views of two other embodiments of the invention, employing radial flow.
Figure 4:
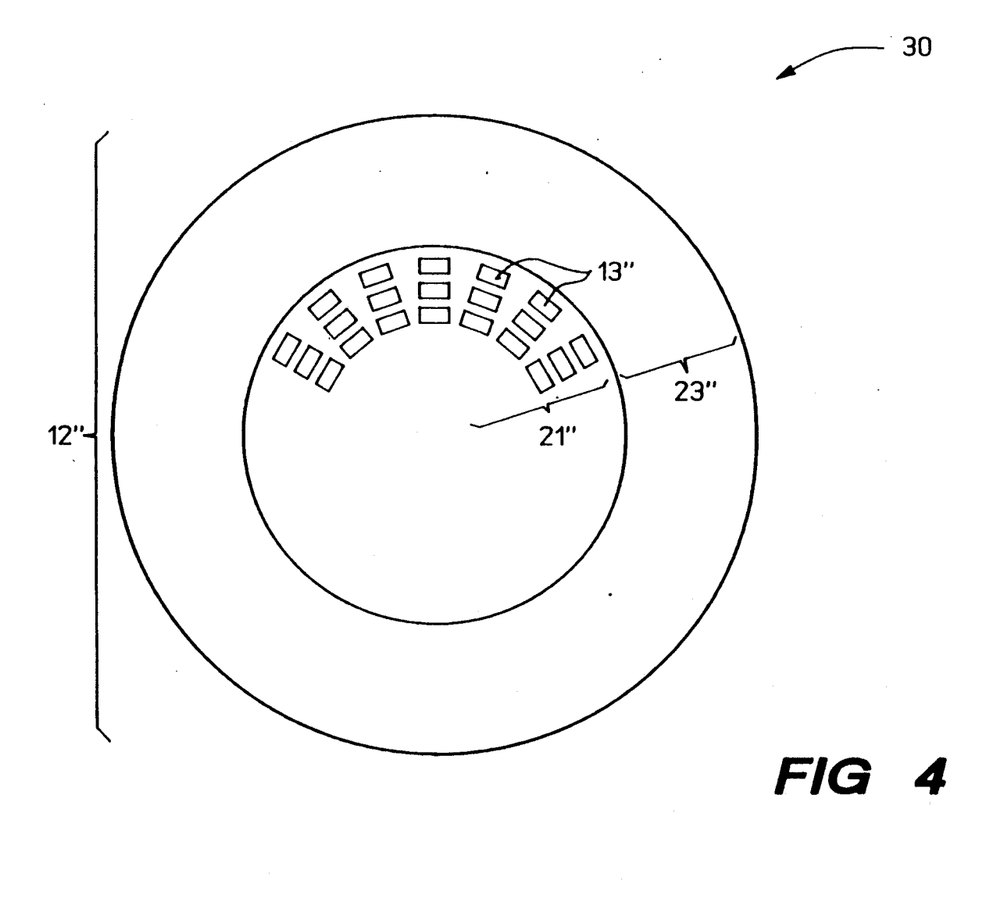

FIG. 3 illustrates a top view of an embodiment 29 that uses a circular or oval-shaped slab 12', with the chips 13' and evaporator chamber 21' being positioned near the circumference of the slab 12' and the condenser chamber 23' being positioned near the center. The flow of vapor is approximately radially inward, and the flow of liquid in the wick(s) is approximately radially outward. In another embodiment 30 using a circular or oval-shaped slab, shown in FIG. 4, an evaporator chamber 21" can be positioned near the center of a circular or oval-shaped slab 12" and a condenser chamber 23" can be positioned near the circumference of the slab. FIG. 4 is the preferred one of the two radial embodiments of the invention.

Figure 5:
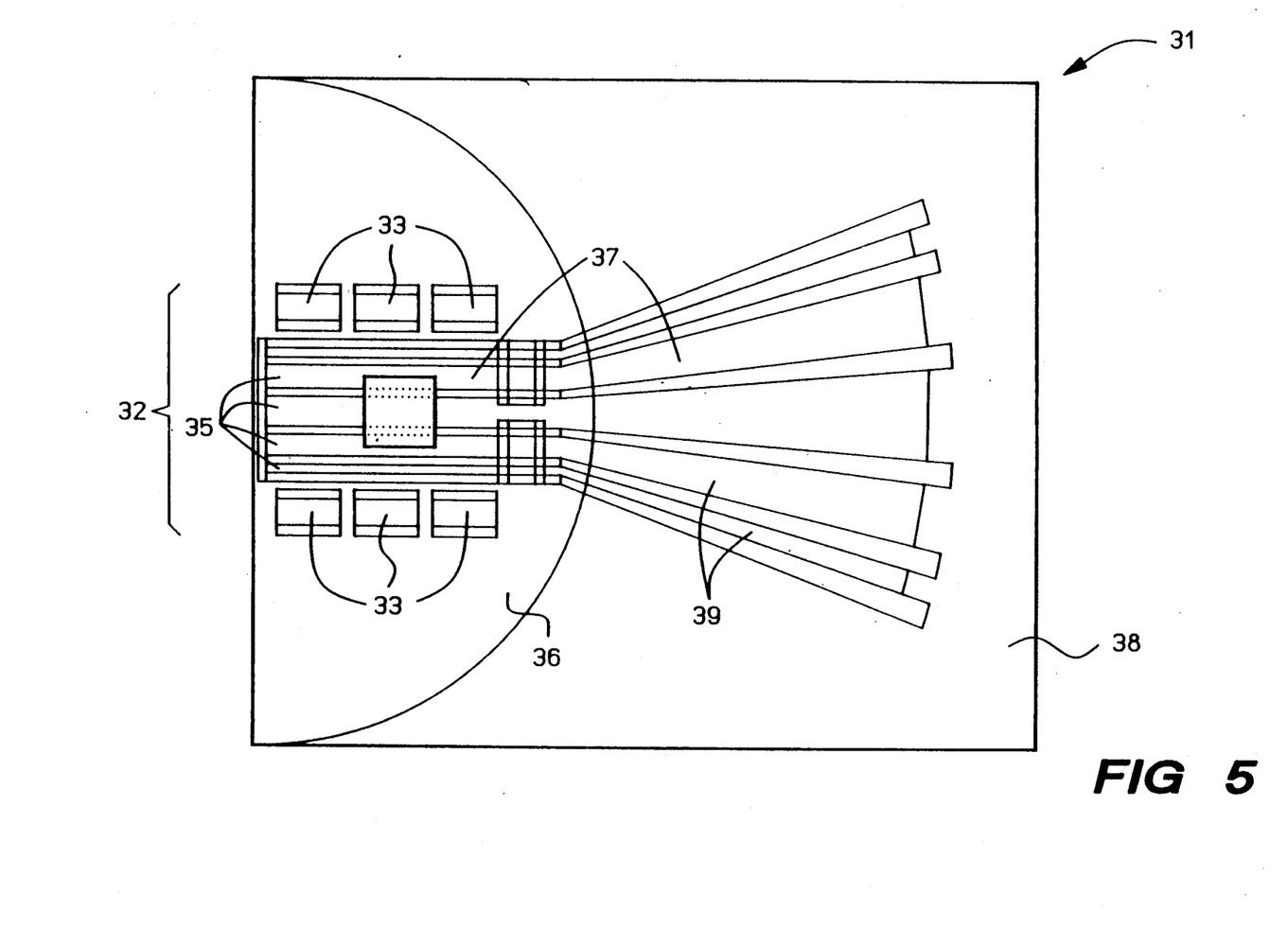
FIG. 5 is a sectional top view of another embodiment, illustrating use of a fan-out configuration for cooling and condensation of the heated working fluid.

In another embodiment 31 of the invention, shown in a top sectional view in FIG. 5, a plurality of chips 33 is positioned at one end of a heat pipe housing, which contains an evaporator chamber 35, configured as part of a substrate 32 at a first end of a heat pipe channel 37. The first end of the heat pipe channel 37 includes a base 36 of dielectric or electrically insulating material, in which the evaporator chamber channels are formed, of a shape resembling a sector of a circle. A second end of the heat pipe channel 37 contains one or a plurality of condenser chambers 39, fanned or flared out to provide a larger area for heat dispersal, and includes a base 38, in which the condenser chamber channels are formed, that may be composed of a different material than the base 36.

Figure 6:
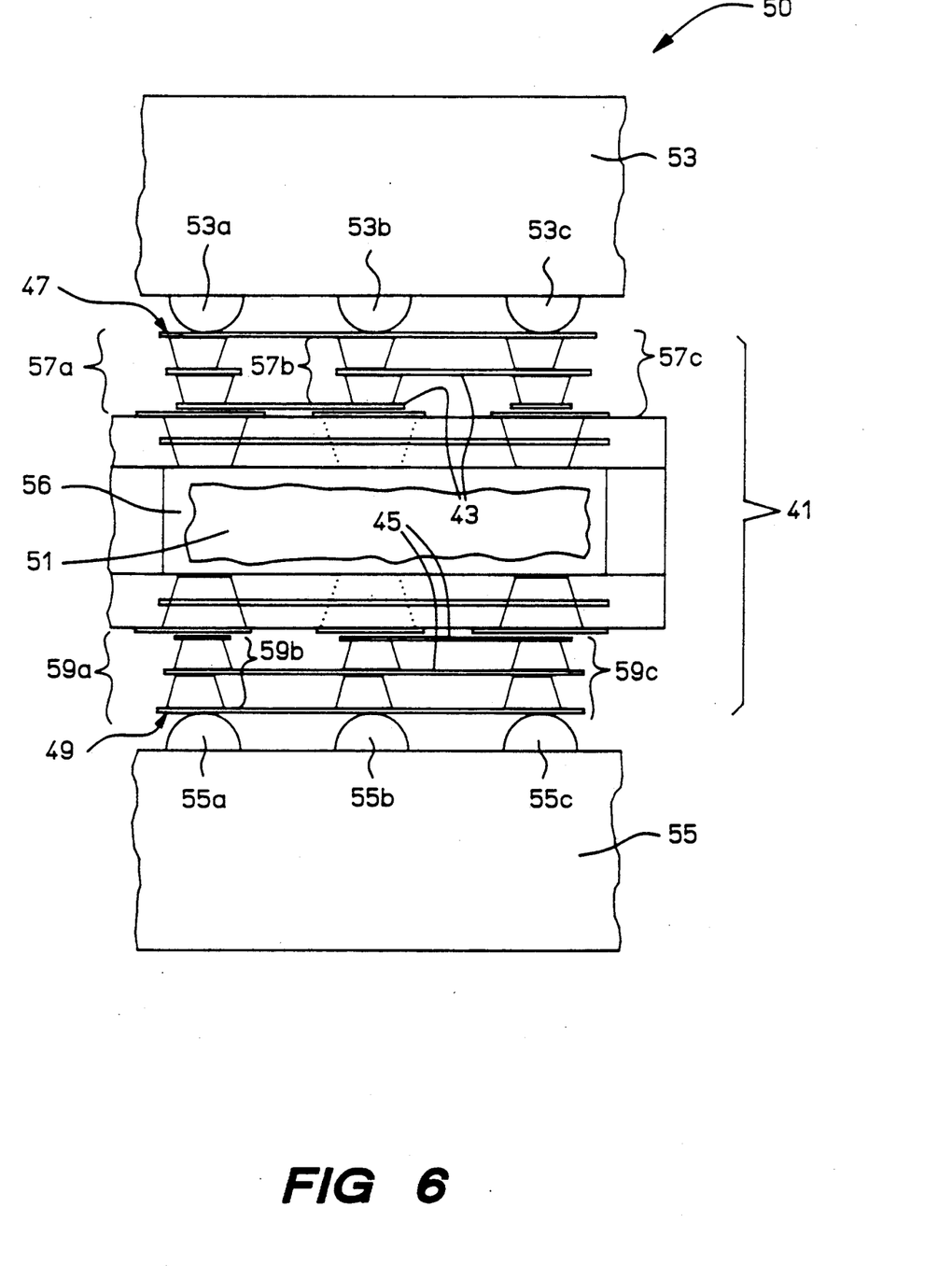
FIGS. 6 and 7 are sectional side views of the substrate, illustrating other details of the invention in two embodiments.

FIGS. 1-5 illustrate some, but not all, features of the invention, where the heat pipe is an integral part of the electrical interconnect substrate. FIG. 6 is a sectional end view of the evaporator end of the substrate, showing many other features of the invention in one embodiment. A substrate 41 is provided with a plurality of electrical interconnect traces 43 and 45 in the substrate interior, oriented approximately parallel to and positioned near first and second opposed substrate faces 47 and 49. The substrate 41 also contains in its interior a plurality of hermetically sealed hollow channels 51 that will each serve as an integrated heat pipe for removal of heat and control of local temperature. One or more chips 53 and 55 is positioned adjacent to each of the opposed substrate interfaces 47 and 49, and a first chip 53 is connected to, or cushioned from direct contact with, the substrate 41 by a plurality of electrically and thermally conductive "solder bumps" 53a, 53b, 53c that extend between the chip 53 and the first face 47 of the substrate. In a similar manner, a second chip 55 is connected to, or cushioned from direct contact with, the substrate 41 by a plurality of solder bumps 55a, 55b, 55c that extend between the chip 55 and the second face 49 of the substrate 41.

Solder bumps 53a and 55a, positioned at selected locations on the respective first and second faces 47 and 49 of the substrate 41, are electrically and thermally connected to conductive columns or vias 57a and 59a, respectively, which are in turn connected to the respective traces 43 and 45, of electrically and thermally conductive material such as tungsten, copper, silver, gold or other suitable conductive material. A conductive solder bump 53a (or 55a) and a conductive via 57a (or 59a) together form a conductive column that extends into the interior of the substrate 41 from a chip 53 (or 55) and provides an electrically conducting path from the chips 53 and 55 to the traces 43 and 45 and a thermally conducting path from the chips 53 and 55 to the channel 51 that is part of the heat pipe chamber. These conductive columns 53a/57a and 55a/59a are preferably specially fabricated columns of appropriate materials. Optionally, the conductive columns 53a/57a and 55a/59a may extend to the edge of, and even through the interior of, the heat pipe channel 51. Alternatively, the conductive columns 53a/57a and 55a/59a may extend through the substrate interior to the wick 56 at the edge of the channel 51 and avoid traversing the interior of the heat pipe channel. Metal compounds containing tungsten, aluminum, copper, silver, gold or similar metals are suitable for the column or via materials.

A typical array of solder bumps might have center-to-center spacing of about 250 $\mu$m, with each solder bump having a diameter of about 150 $\mu$m and a bump height above the substrate of about 75 $\mu$m. For thermal resistance of about 120° C. per Watt (per bump), an arrangement of 500 solder bumps has an equivalent thermal resistance of 0.24° C. per Watt, which is reasonable. After the temperature of a hemispherically shaped solder bump is raised so that the solder bump is softened and flowed, the solder bump material 53a will make contact with an electrical via 57a and will cool into a configuration that is approximately an hyperboloid of revolution. A solder bump may be replaced by another material and/or configuration, such as a wire bond, as long as the replacement is electrically and thermally conducting.

The solder bump 53a may be replaced by a plurality of approximately spherical objects contained in a Z-poly adhesive, one of a family of unidirectional, electrically conductive products available from A. I. Technology of Trenton, N.J. The product data sheet for these Z-poly adhesives indicates that electrical resistivity ranges from about $5 \times 10^{-5}$ Ohm-cm to about $10^{-4}$ Ohm-cm, depending on the current per unit area carried by the metal filler used for the adhesive. Bond shear strength decreases by a factor of about four with an increase in the number of thermal cycles the adhesive undergoes, but the bond shear strengths are still reasonable. Contact electrical resistance increases by less than a factor of two with increase in the number of thermal cycles, if the ambient temperature is kept below T=85° C. Metal atom migration is a problem with the silver filler, but metal fillers containing gold, platinum palladium, titanium, zirconium, aluminum, tungsten, nickel, tin and Kovar do not appear to migrate. Adhesive with metal fillers containing lead, solder, copper, zinc, phosphor, bronze lie in between these extremes in tendency to migrate. Precious metal fillers all have good thermal stability, up to temperatures as high as the polymeric adhesives can stand.

The working fluid used in the IC cooling apparatus should preferably have an operating temperature selected from a range of about $-40°\text{C}. \leq T \leq 120°\text{C}$. and should have a vaporization temperature $T_{vap}$ that is approximately equal to, or a few degrees Celsius below, the temperature $T_{chip}$ at which the operating IC is to be kept. Table 1 sets forth various liquids, their vaporization temperatures and surface tension coefficients at the vaporization temperature that may be suitable for these purposes.

TABLE 1

Heat Pipe Working Fluids

| Working Fluid | Useful Temp. Range | T(vaporiz) | Surface Tension |
|---|---|---|---|
| Ammonia | −60°C.-100° | −33° C. | 3.41 (Newt/meter) |
| Freon 11 | −40-120 | 24 | 1.87 |
| Pentane | −20-120 | 28 | 1.50 |
| Freon 113 | −10-100 | 48 | 1.64 |
| Acetone | 0-120 | 57 | 1.90 |
| Methanol | 10-130 | 64 | 1.90 |
| Flutec PP2 | 10-160 | 76 | 0.87 |
| Ethanol | 0-130 | 78 | 2.12 |
| Heptane | 0-150 | 98 | 1.29 |
| Water | 0-100 | 100 | 5.89 |
| Toluene | 50-200 | 110 | |

Useful materials for the electrically non-conducting substrate material include, but are not limited to, Kyocera $Al_2O_3$ ceramic, Sumitomo sintered AlN, and undoped silicon, which have thermal conductivities of 0.1673, 1.7987 and 1.5 (Watts/cm-°C.), respectively, and thermal expansion coefficients of $7.0 \times 10^{-6}$, $4.5 \times 10^{-6}$ and $2.6 \times 10^{-6}$ per degree C., respectively. It is important that the thermal expansion coefficients of the substrate and semiconductor chip material be matched as closely as possible, preferably within a difference of no more than $3 \times 10^{-6}/°\text{C}.$, so that thermal expansion mismatch stress is not too large.

Figure 7:
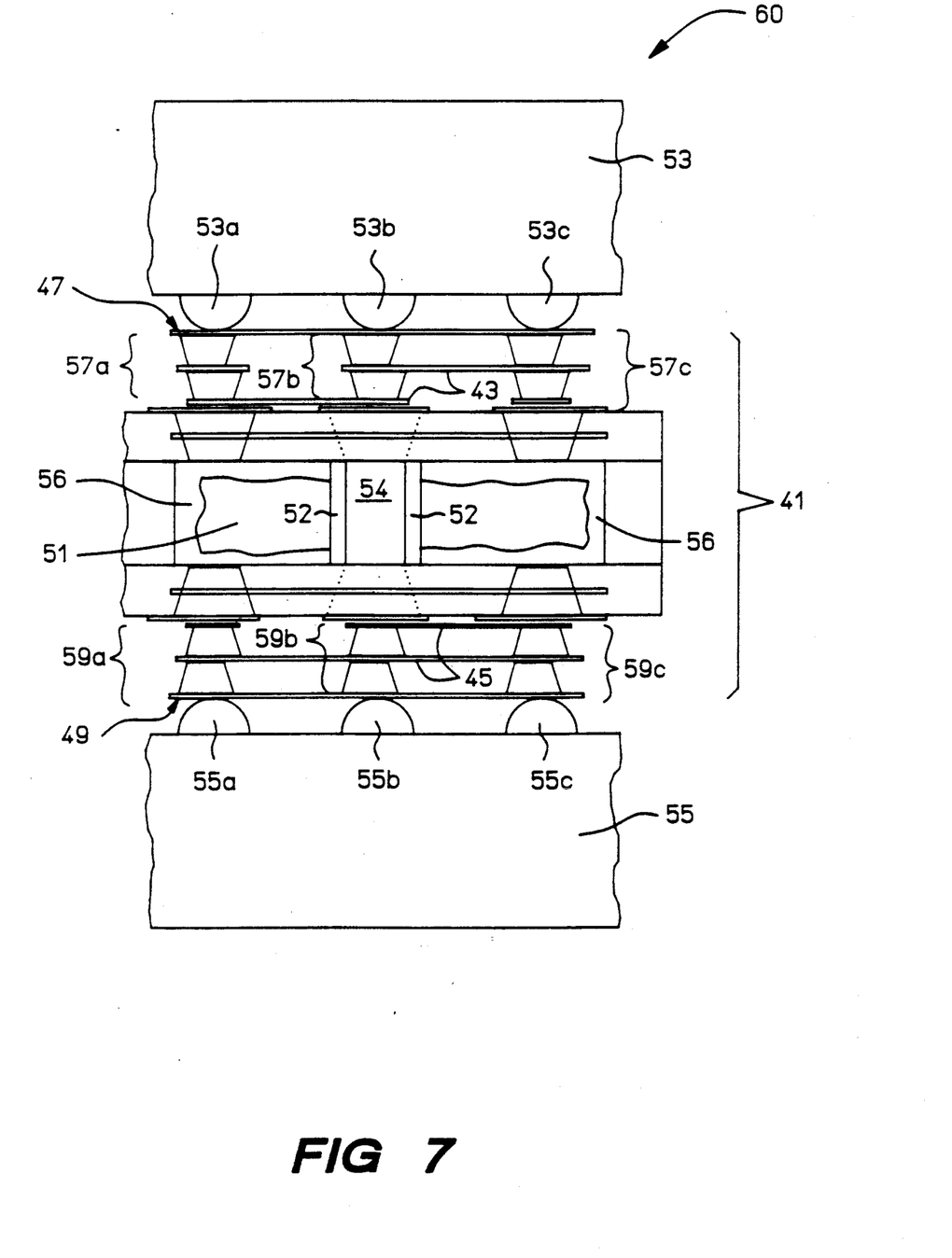

FIG. 7 is a sectional end view of an alternative embodiment 60, similar to that of FIG. 6 except that a column or via 54 now extends through the substrate 41 from one surface to an opposed surface on the other side as shown. Where the column 54 passes through the heat pipe channel 51 and thus may contact the working fluid and/or the wick material 56, the column 54 is provided with an electrically insulating sheath 52, made from a material such as ceramic. This sheath insulates the column from electrical contact with the working fluid and/or wick material, if either this fluid or this material is electrically conducting. The embodiment 60 shown in FIG. 7 may be used where one or more electrical interconnections must be made between chips on opposite sides of the heat pipe channel 56. The thickness of the sheath 52 will provide electrical isolation of the column 54 and the heat pipe channel contents but provide a path for thermal energy flow.

Figure 8:
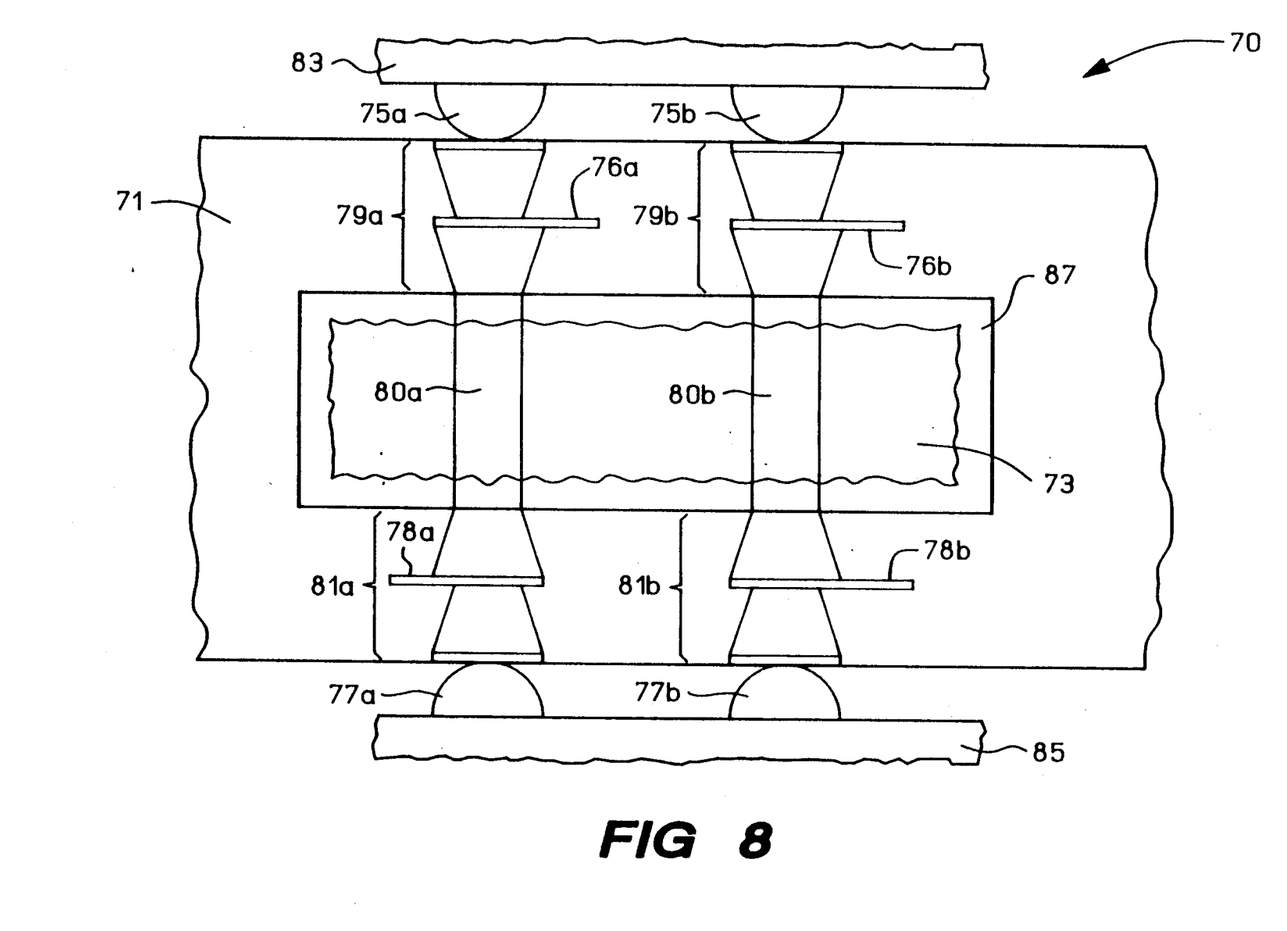
FIG. 8 is a sectional end view of a portion of the evaporator chamber, showing an electrical via passing through the chamber in another embodiment.

FIG. 8 illustrates an alternative embodiment 70 in a sectional end view. The substrate 71 contains a plurality of hermetically sealed hollow channels 73 that serve as heat pipe channels, and a plurality of solder bumps 75a, 75b, 77a and 77b provide electrical and thermal connection of adjacent chips 83 and 85 to electrical vias 79a, 79b, 81a and 81b as shown. Selected pairs of the electrical vias, such as 79a and 81a, are electrically and thermally connected together by a via 80a that passes through the heat pipe channel 73 and through a wick 87 used by that heat pipe. Electronic components on a chip 83 or 85 may also be connected to electronic components on one or more other chips (not shown) through the electrically conductive columns 80a and 80b and electrical interconnect traces 76a, 76b, 78a and 78b. Where a via, such as 80a passes through a heat pipe channel 73, the heat pipe working fluid in that heat pipe channel is directly heated by contact with the via 80a. In this embodiment, the working fluid and the material used for the wick must be electrically non-conducting so that distinct electrical vias such as 79a and 79b are not electrically shorted together by an electrical path that is completed through the wick material or through the working fluid. A suitable non-conducting working fluid here is Flutec PP2. It is also preferable to use non-electrically conducting wick material and working fluid for the heat pipe wicks and working fluids used in the embodiment illustrated in FIG. 8. In the embodiments shown in FIGS. 6, 7 and 8, the diameters of the heat pipe channels may range from 10 to 300 mils (250-7600 $\mu$m).

Figure 9:
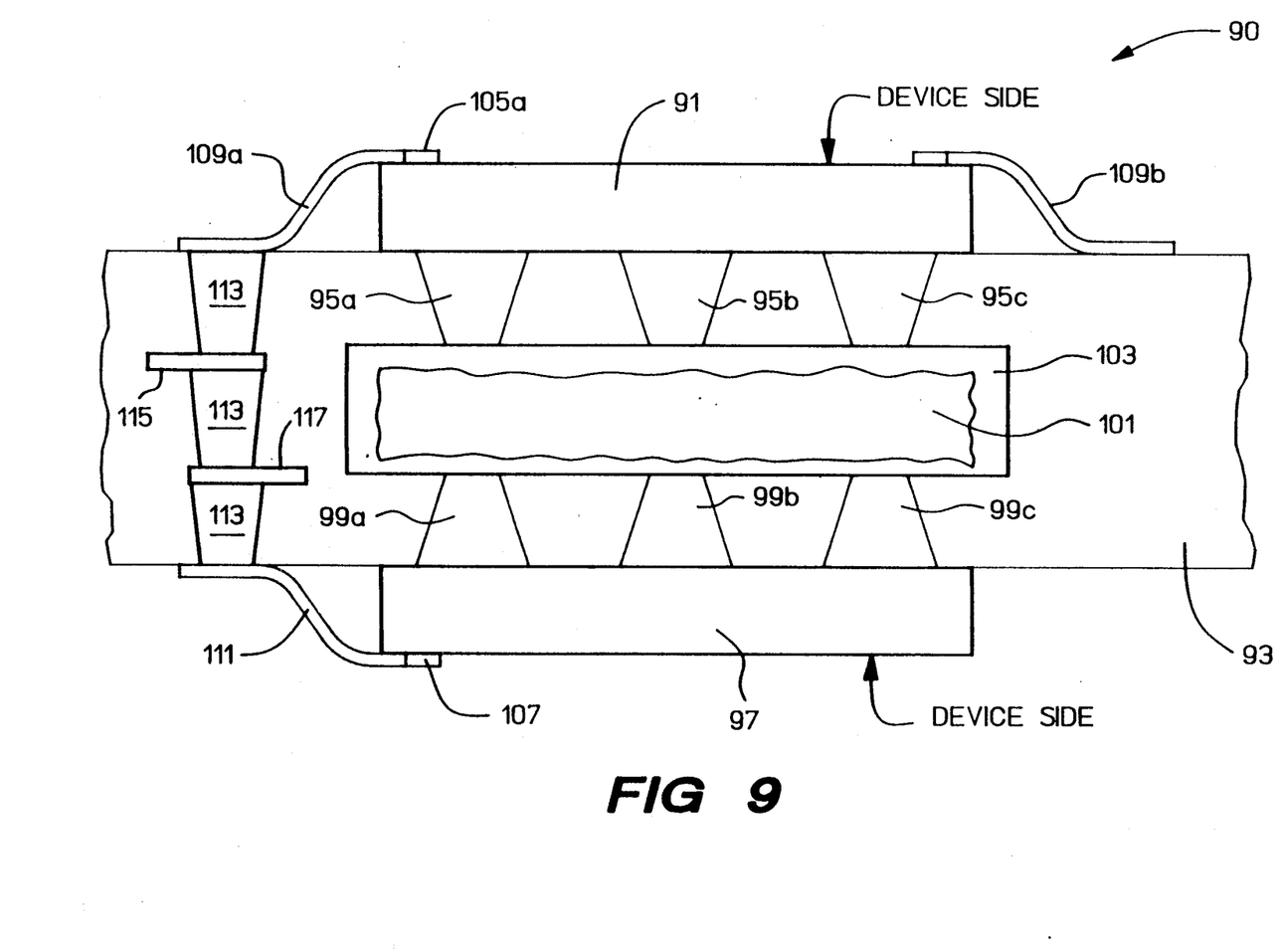
FIG. 9 is a sectional end view of another embodiment.

FIG. 9 is a sectional end view of another embodiment 90 of the invention, in which one or more chips 91 is turned device side up so that the electrical contacts of the chip are exposed on the chip upper surface. A first chip 91 rests against a substrate 93, made of ceramic or other electrically non-conducting material, and the substrate has one or a plurality of thermally conductive vias or columns 95a, 95b, 95c therein. A second chip 97 rests against the substrate 93, and the substrate has a second plurality of thermally conductive vias or columns 99a, 99b, 99c therein. Within the interior of the substrate 93, one or more hollow heat pipe channels 101 is formed, and each via or column such as 95a or 99a extends from a lower surface of the respective chip 91 or 97 to a boundary of the heat pipe channel 101, or beyond. The heat pipe channel 101 has a wick 103 of suitable material positioned along the boundaries of the heat pipe channel and has a working fluid contained in the heat pipe channel that perform as discussed above for the other embodiments. At an exposed surface of the chip 91 (or 97), one or more electrical contacts 105a and 105b (or 107) for the chip are provided, and one or more electrical interconnects 109a and 109b (or 111) provide electrical interconnection between the chip 91 (or 97) and other chips that are not shown in FIG. 9. Electrically conducting vias or columns 113 that are spaced apart from the heat pipe channel 101 provide electrical interconnect between chips, such as 91 and 97, on different faces of the substrate. An electrically conductive column 113 may have one or more electrical interconnect traces 115 and 117 connected thereto to provide an electrical connection between two or more electronic components located on different chips.

The working fluid should have as high a surface tension coefficient $\sigma$, (force per unit length), as possible, in order to overcome opposing forces within a wick. One constraint on the surface tension is that the driving force developed be greater than the sum of the gravitational and wick frictional forces opposing movement of the working fluid from the condensation chamber to the expansion chamber. This constraint requires that the surface tension coefficient $\sigma$ satisfy the inequality $$\sigma \cos\theta_W > ahpg/4 + 4f_W LQ/n\pi a^2,$$

where a is wick pore diameter, $\rho$ is mass density of the working fluid in the wick, h and L are end-to-end elevation difference and end-to-end length of the wick, respectively, g is the gravitational force parameter, $f_W$ is frictional force per unit area and per unit velocity exerted on the working fluid by the surface of a wick pore, Q is volume flow through the assembly of wick conduits, n is the average number of wick conduits available for flow of the working fluid therethrough, and $\theta_W$ is the wetting angle of the working fluid, determined in part by the working fluid surface tension characteristics. A representative value for $\cos \theta_W$ is about 0.5.

The surface tension coefficient $\sigma$ of a liquid decreases strongly with increasing temperature T, as can be seen from examination of the values of $\sigma(T)$ for 18 substances, including water, organic liquids and liquid metals, set forth in Appendix A of *Heat Pipes* by P. Dunn and D. A. Reay, Pergamon Press, Third Edition, 1982, pp. 272–281. From these data, one notes that $\sigma(T = T_{vap})$ for the materials in Table 1 varies from 0.87–5.89 Newtons/meter, which is acceptable.

With reference to any of FIGS. 1, 2 or 5, the condenser end of a heat pipe used in the invention is not adjacent to the chip or chips that hold the electronic components whose temperatures are to be controlled. Thus, the material surrounding or contiguous to the condensor end of a heat pipe may be of a different material than the material that surrounds or is contiguous to the expansion end of the heat pipe. The condenser end of the heat pipe may even by cantilevered as long as the substrate material is sufficiently strong to support the cantilevered condenser end and the fins or other heat dispersion means that are supported by the condenser end.

We claim:

1. An apparatus for controlling the temperature of one or more chips with electronic component thereon and for providing electrical interconnections between two or more such chips, the apparatus comprising:

a substrate having at least one channel completely contained therein, each said channel defining a hollow extending from a first end to a second end of the channel, the substrate having one or more faces with one or more chips positioned on at least one face over the first end of said channel;

a heat pipe wick, having a working fluid contained therein, completely situated within the hollow of the channel extending from the first end of the channel to the second end of the channel;

a heat pipe evacuator chamber in fluid communication with the wick at the first end of the channel, for receiving working fluid from the wick adding thermal energy to the working fluid, and directing the working fluid toward the second end of the channel;

a heat pipe condenser chamber in fluid communication with the wick at the second end of the channel, for receiving working fluid as a gas from the wick at a high temperature, withdrawing thermal energy from the working fluid, and returning the working fluid as a liquid within the wick to the first end of the channel;

heat dissipation means in thermal contact with the condenser chamber, for withdrawing thermal energy from the condenser chamber, dispersing or dissipating this thermal energy, and maintaining the temperature of the condenser chamber within a predetermined temperature range;

a plurality of columns of material of high electrical and thermal conductivity, each of said plurality of conducting columns being effective for direct thermal contact between at least one chip on a substrate face and at least one chip on another substrate face;

a plurality of sheaths, each sheath surrounding one of said plurality of columns for insulating the column from direct contact with said wick and said working fluid; and a plurality of electrical interconnect traces of material located on the substrate, each trace electrically connecting at least two distinct chips through at least two conducting columns;

whereby a substantial portion of the heat generated by electronic components on said chips and said plurality of interconnect traces of material is removed by said working fluid in said wick.

2. The apparatus of claim 1, wherein at least one of said conducting columns has direct contact with said working fluid in said channel.

3. The apparatus of claim 2, wherein said working fluid and said heat pipe wick are electrically non-conducting.

4. The apparatus of claim 1, wherein at least one of said conducting columns is surrounded by a sheath of electrically non-conducting material within said channel so that said working fluid and said heat pipe do not directly contact this conducting column.

5. The apparatus of claim 1, wherein said heat dissipation means maintains the temperature of said heat pipe condenser chamber in the interval of temperature T given by $-40° C. \leq T \leq 120° C.$ 6. The apparatus of claim 1, wherein the power density P for withdrawal of said thermal energy from each of said chips by said working fluid lies in the range $0.5 \text{ Watt/cm}^2 \leq P \leq 50 \text{ Watts/cm}^2$.

7. The apparatus of claim 1, wherein said working fluid is drawn from a class of fluids with vaporization temperatures $T_{vap}$ lying in the temperature range $-40° C. \leq T_{vap} \leq 120° C.$, the class consisting of ammonia, freon 11, freon 113, pentane, acetone, methanol, flutec PP2, ethanol, heptane, water and toluene.

8. An apparatus for controlling the temperature of one or more chips with electronic components thereon and for providing electrical interconnection between two or more such chips, the apparatus comprising:

a substrate having at leat one channel completely contained therein, each of said channel defining a hollow extending from a first end to a second end of the channel, the substrate having one or more faces, with one or more chips positioned on at least one face, with at least one chip being positioned device side up over the first end of said channel;

a heat pipe wick, having a working fluid contained therein, completely situated within the hollow of the channel, extending from the first end of the channel toward the second end of the channel;

a heat pipe evaporator chamber in fluid communication with the wick at the first end of the channel, for receiving working fluid from the wick, adding thermal energy to the working fluid, and directing the working fluid to the second end of the channel;

a heat pipe condenser chamber in fluid communication with the wick at the second end of the channel, for receiving working fluid as a gas from the wick at a high temperature, withdrawing thermal energy from the working fluid, and returning the working fluid as a liquid within the wick to the first end of the channel;

heat dissipation means in thermal contact with the condenser chamber, for withdrawing thermal energy from the condenser chamber, dispersing or dissipating this thermal energy, and maintaining the temperature of the condenser chamber within a predetermined temperature range;

a plurality of columns of material of high thermal conductivity, each conducting column for direct thermal contact between at least one chip on a substrate face and a wall of said channel; and a plurality of electrical interconnect traces of material located on the surface that electrically connect electronic components on two or more chips, each trace electrically contacting at least two distinct electronic components through an electrically conducting connection between a trace and an electrical component on a chip that is positioned device side up, whereby a substantial portion of the heat generated by electronic components on said chips and said plurality of electrical interconnect traces of material is removed by said working fluid in said wick.

9. The apparatus of claim 8, further comprising one or more columns of material of high electrical conductivity, with each electrically conducting column providing electrical contact between at least one of said electronic components on one of said chips and at least one of said electrical interconnect traces.

10. The apparatus of claim 8, further comprising one or more columns of material of high electrical conductivity, with each electrically conducting column providing electrical contact between at least one of said electronic components on one of said chips and at least one of said electronic components on a second of said chips.

11. An apparatus for controlling the temperature of one or more chips with electronic components thereon and for providing electrical interconnection between two or more such chips, the apparatus comprising:

a substrate having at least one channel completely contained therein, each said channel defining a hollow extending from a first end to a second end of the channel, the substrate having one or more faces with one or more chips positioned on at least one face over the first end of said channel;

a heat pipe wick, having a working fluid contained therein, completely situated within the hollow of the channel, extending from the first end of the channel toward the second end of the channel;

a heat pipe evaporator chamber in fluid communication with the wick at the first end of the channel, for receiving working fluid from the wick, adding thermal energy to the working fluid, and directing the working fluid to the second end of the channel;

a heat pipe condenser chamber in fluid communication with the wick at the second end of the channel, for receiving working fluid as a gas from the wick at a high temperature, withdrawing thermal energy from the working fluid, and returning the working fluid as a liquid within the wick to the first end of the channel;

heat dissipation means in thermal contact with the condenser chamber, for withdrawing thermal energy from the condenser chamber, dispersing or dissipating this thermal energy, and maintaining the temperature of the condenser chamber within a predetermined temperature range;

a plurality of columns of material of high electrical and thermal conductivity, each of said plurality of conducting columns being effective for direct thermal contact between at least one chip on a substrate face and the working fluid in the evaporator chamber; and a plurality of electrical interconnect traces of material located on the substrate, each trace electrically connecting at least two distinct chips through at least two conducting columns, whereby a substantial portion of the heat generated by electronic components on said chips and said plurality of electrical interconnect traces of material is removed by said working fluid in said wick.

12. The apparatus of claim 11, wherein said high thermal conductivity material for said conducting column includes said material from which said electrical interconnect traces are made.

13. The apparatus of claim 11 wherein said heat dissipation means maintains the temperature of said heat pipe condenser chamber in the interval of temperature T given by $-40°\text{C.} \leq T \leq 120°\text{C.}$ 14. The apparatus of claim 13, wherein the power density P for withdrawal of said thermal energy from each of said chips by said working fluid lies in the range $0.5 \text{ Watt/cm}^2 \leq P \leq 50 \text{ Watts/cm}^2$.

15. The apparatus of claim 11, wherein said working fluid is drawn from a class of fluids with vaporization temperatures $T_{vap}$ lying in the temperature range $-40°\text{C.} \leq T_{vap} \leq 120°\text{C.}$, the class consisting of ammonia, freon 11, freon 113, pentane, acetone, methanol, flutec PP2, ethanol, heptane, water and toluene.

16. The apparatus of claim 11, wherein said working fluid, in liquid form, has a surface tension coefficient of at least 0.8 Newtons/meter near the vaporization temperature of said working fluid.

17. The apparatus of claim 11, further comprising a plurality of evaporator chambers, with each evaporator chamber having said working fluid contained therein that is in thermal contact with two or more electronic component chips through said conducting columns, where the evaporator chambers are arranged in a radial pattern surrounding said condensor chamber.

18. The apparatus of claim 11, further comprising a plurality of condensor chambers, arranged in a radial pattern surrounding said evaporator chamber.

* * * * *